United States Patent
Heinz et al.

(10) Patent No.: US 6,414,418 B1
(45) Date of Patent: Jul. 2, 2002

(54) PIEZOELECTRIC ACTUATOR

(75) Inventors: Rudolf Heinz, Renningen; Friedrich Boecking, Stuttgart, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/674,772

(22) PCT Filed: Jan. 14, 2000

(86) PCT No.: PCT/DE00/00121

§ 371 (c)(1),
(2), (4) Date: Dec. 29, 2000

(87) PCT Pub. No.: WO00/52769

PCT Pub. Date: Sep. 8, 2000

(30) Foreign Application Priority Data

Mar. 4, 1999 (DE) .......................... 199 09 452

(51) Int. Cl.$^7$ .............................................. H01L 41/04
(52) U.S. Cl. ....................................................... 310/366
(58) Field of Search .................................. 310/328, 366

(56) References Cited

U.S. PATENT DOCUMENTS

| | | | | |
|---|---|---|---|---|
| 3,418,980 A | * | 12/1968 | Benson | |
| 3,598,506 A | * | 8/1971 | O'Neill | 417/383 |
| 4,011,474 A | * | 3/1977 | O'Neill | 310/328 |
| 4,471,256 A | * | 9/1984 | Igashira et al. | 310/328 |
| 4,533,059 A | * | 8/1985 | Kapolas et al. | 215/230 |
| 4,803,393 A | * | 2/1989 | Takahashi | 310/328 |
| 4,803,763 A | * | 2/1989 | Eturo et al. | 29/25.35 |
| 4,814,659 A | * | 3/1989 | Sawada | 310/328 |
| 4,845,399 A | * | 7/1989 | Yasuda et al. | 310/366 |
| 4,995,587 A | * | 2/1991 | Alexius | 251/129.06 |

FOREIGN PATENT DOCUMENTS

| | | | |
|---|---|---|---|
| JP | 07-007193 | * | 1/1995 |
| JP | 07-154005 | * | 6/1995 |
| JP | 2000-252537 | * | 9/2000 |
| JP | 2000-323766 | * | 11/2000 |
| JP | 2001-069771 | * | 3/2001 |

* cited by examiner

Primary Examiner—Nestor Ramirez
Assistant Examiner—Peter Medley
(74) Attorney, Agent, or Firm—Ronald E. Greigg

(57) ABSTRACT

The invention relates to a piezoelectric actuator, in particular for actuating control valves or injection valves in motor vehicles, having an actuator body in the form of a multi-layered laminate made up of stacked layers of piezoelectric material with intervening metallic or electrically conductive layers that function as electrodes, which, in alternating fashion, electrically contact common electrode strips disposed on the circumference in the longitudinal direction of the actuator body, and having electrical connecting conductors which, in order to supply the operating voltage to the piezoelectric actuator, electrically contact the respective common electrode strips. On at least one end face remote from the valve, the actuator body has a covering layer made of piezoelectrically inactive ceramic material and the connecting conductors electrically contact the common electrode strips only in the vicinity of this covering layer.

5 Claims, 1 Drawing Sheet

PIEZOELECTRIC ACTUATOR

CROSS-REFERENCES TO RELATED APPLICATIONS

This is a 35 USC 371 application of PCT/DE00/00121 filed on Jan. 14, 2000.

BACKGROUND OF THE INVENTION

1. Prior Art

This invention is directed to piezoelectric actuators and in particularly to for actuating control valves useful or injection valves in motor vehicles of the type, having an actuator body in the form of a multilayered laminate made up of stacked layers of piezoelectric material with intervening metallic or electrically conductive layers that function as electrodes, which, in alternating fashion, electrically contact common electrode strips disposed on the circumference, in the longitudinal direction of the actuator body, and having electrical connecting conductors which, in order to supply the operating voltage to the piezoelectric actuator, electrically contact the common electrode strips.

2. Description of the Prior Art

A piezoelectric actuator of the type with which this invention is concerned has been disclosed, for example, by DE 196 50 900 A1 assigned to Robert Bosch GmbH.

If a pulsating electrical voltage acts on their electrode layers, multilayered piezoelectric actuators of this kind execute analogously pulsating strokes by changing the distance between their two end faces. The end face oriented toward the control or injection valve tappet-like mechanism, which transmits the actuator stroke to the valve.

In the above-mentioned DE 196 50 900 A1, the connection of the piezoelectric actuator is produced in the active region of the actuator body. As a result, the electrode strips, which are disposed on both sides of the actuator body and transmit the electrical voltage to the electrode layers, overlap the full length of the active region of the actuator body and this results in the disadvantage that the electrical connecting conductors must execute the stroke along with the actuator. In addition, the contacting of this actuator with the common electrode strips is problematic since such a contact that is produced by a solder connection has a tendency to develop fractures during operation of the actuator.

SUMMARY

A piezoelectric actuator of this generic type should be embodied so that a reliable contacting of the connecting conductors with the common electrode strips is achieved over the life of the piezoelectric actuator or the valve that is equipped with it and that at the same time, the usually soldered connections can be replaced by clamped connections.

The essence of the invention lies in taking the contacting of the connecting conductors with the common electrode strips out of the active region of the piezoelectric actuator.

This is advantageously achieved in accordance with the invention by virtue of the fact that on at least one end face remote from the valve end, the actuator body has a covering layer made of piezoelectrically inactive ceramic material and that the connecting conductors electrically contact the common electrode strips only in the vicinity of this covering layer.

Although for the contacting of the piezoelectric actuator of this invention, the only essential element is the piezoelectrically inactive covering layer disposed on the end face of the actuator body remote from the valve end, the piezoelectric actuator body can naturally also have a piezoelectrically inactive covering layer on its end face oriented toward the valve.

Because the contacting of the connecting conductors with the common electrode strips is disposed in the vicinity of the piezoelectrically inactive covering layer of the actuator body, which is not subjected to the actuator stroke, there are no longer any connections in the active region of the piezoelectric actuator and the development of fractures at solder points and the occurrence of contacting problems are prevented during its operation.

In an exemplary embodiment of the piezoelectric actuator according to the invention, the common electrode strips contact the connecting conductors on the circumference of the covering layer.

In another exemplary embodiment of the piezoelectric actuator according to the invention, the common electrode strips are routed to the end face of the covering layer and contact the connecting conductors there.

The contacting of the common electrode strips with the connecting conductors can either be by soldering or clamping.

In order to route the contacting conductors to the actuator body through a valve housing, it can be advantageous if the contact points where the connecting conductors contact the common electrode strips on the piezoelectrically inactive covering layer are disposed diametrically opposite from one another. This is true both for piezoelectric actuators with a circular cross section and for those with a rectangular or square cross section.

It should be noted that the embodiment of the common electrode strips along the actuator body is not a subject of this invention so that in the exemplary embodiments described below, it is simply assumed that these electrode strips have the form of flat bands or ribs resting against the circumference of the actuator body.

BRIEF DESCRIPTION OF THE DRAWINGS

The description below explains two different exemplary embodiments of a piezoelectric actuator according to the invention taken in conjunction with the drawings, in which.

DESCRIPTION OF THE EXEMPLARY EMBODIMENTS

Figure 1:
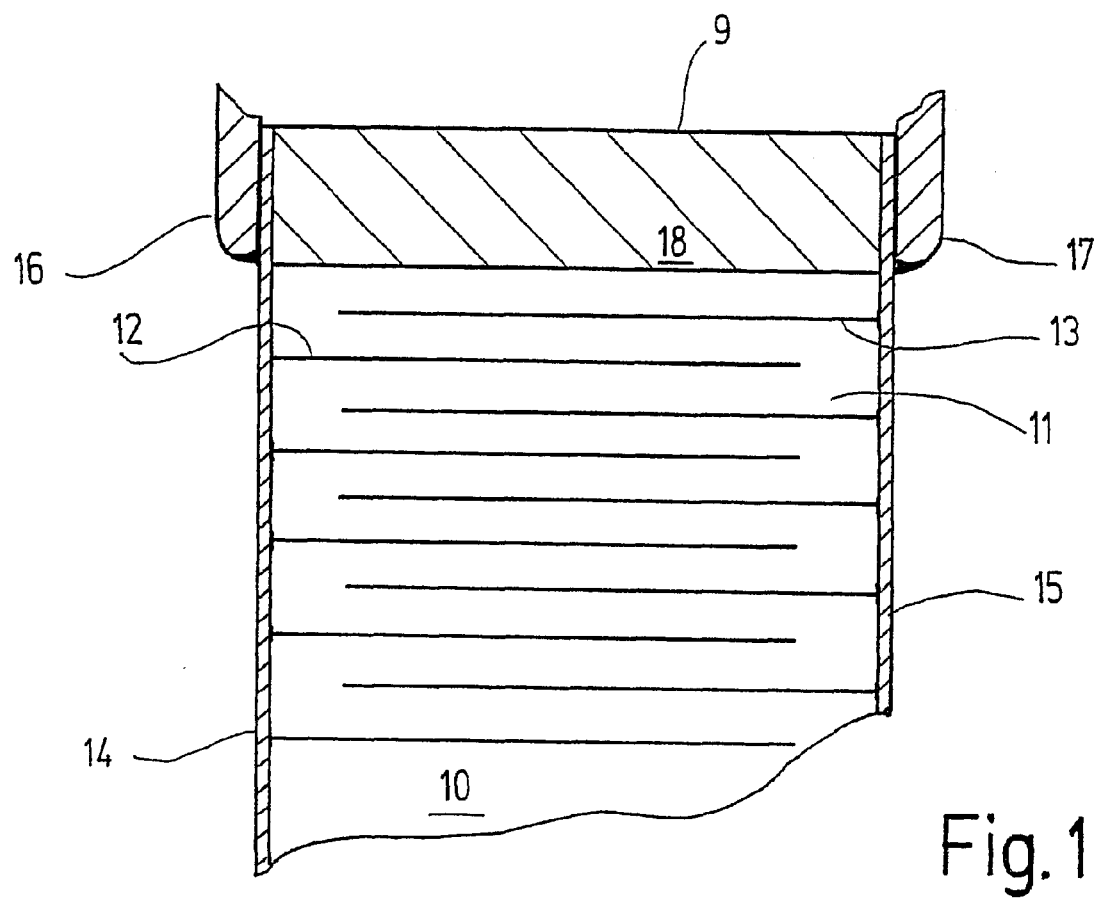
FIG. 1 schematically depicts a part of a longitudinal section through a piezoelectric actuator embodied in accordance with a first exemplary embodiment.

In the form of a partial longitudinal section, FIG. 1 shows a first exemplary embodiment of the piezoelectric actuator, which has an actuator body 10 in the form of a multilayered laminate made up of stacked layers of piezoelectric material 11 with intervening metallic or electrically conductive layers 12, 13 that function as electrodes, which, in alternating fashion, electrically contact common electrode strips 14, 15 disposed on the circumference of the actuator body in the longitudinal direction, and having (partially shown) electrical connecting conductors 16, 17 which electrically contact the respective common electrode strips 14, 15 in order to supply the operating voltage to the piezoelectric actuator. As is shown, the common electrode strips 14, 15 are disposed on diametrically opposite sides of the circumference of the piezoelectric actuator body 10, where the alternating electrode layers 12 and 13 alternatingly protrude freely to the circumference of the actuator body 10. The electrode strips 14 and 15 can have a different form than the one shown in FIG. 1, and in this instance, only by way of example, have the form of rectilinear, flat strips or ribs in the axial direction of the actuator body 10.

On its end face (at the top in FIG. 1) disposed opposite from the end face, which is oriented toward the valve and is subjected to the actuator strokes, the actuator body 10 has a covering layer 18 of piezoelectrically inactive ceramic material and the connecting conductors 16 and 17 electrically contact the electrode strips 14 and 15 only in the vicinity of this covering layer 18. According to FIG. 1, the contact points where the connecting conductors 16 and 17 contact the common electrode strips 14, 15 are disposed on the circumference of the covering layer 18. Each connecting conductor 16 and 17 can either be soldered to the respective common electrode strip 14 and 15 or can be connected to it with a clamp connection. Naturally, one of the connecting conductors 16 or 17 can also be soldered while the other is clamped.

Figure 2:
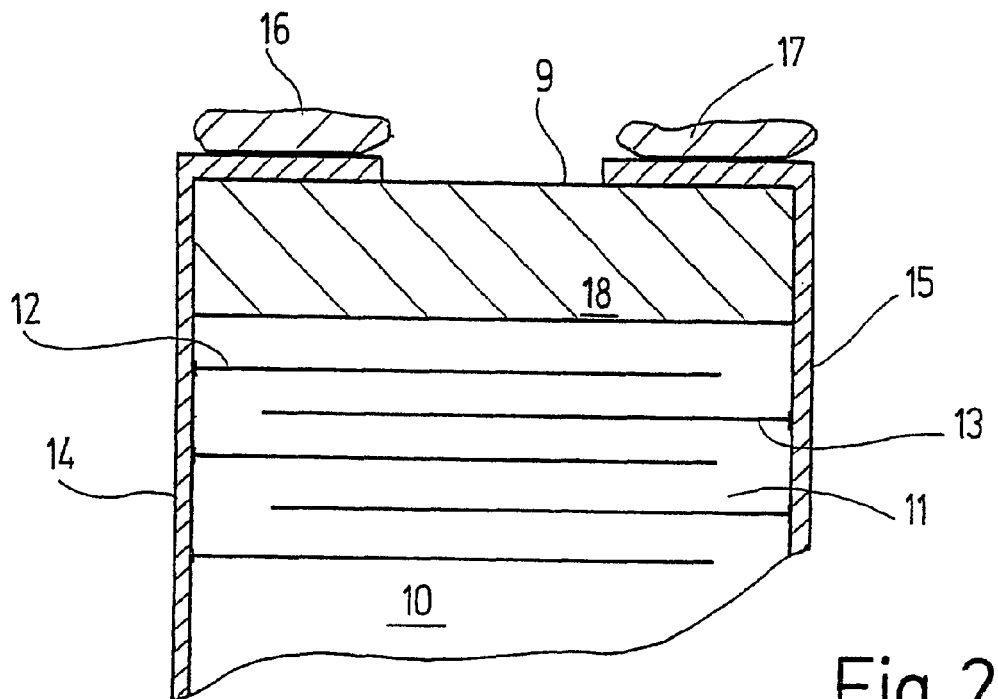
FIG. 2 shows the same view of a second exemplary embodiment of a piezoelectric actuator according to the invention.

If, according to FIG. 2, the common electrode strips 14, 15 are rerouted to the covering layer of the piezoelectrically inactive covering layer 18, when the actuator body is secured in place, a clamped contacting of the common electrode strips with the connecting conductors 16 and 17 is advantageous. It should be noted here that a multilayered piezoelectric actuator of the type described here must be installed under a mechanical initial stress since it would otherwise tear apart when actuated. The mechanical initial stress is exerted by means of suitable prestressing members (not shown) on the end faces of the actuator body 10 so that on the end face, which is oriented toward the valve and is not shown in the FIGS., the actuator strokes are executed counter to the initial stress exerted by the prestressing elements.

Naturally the end face of the actuator body 10 oriented toward the valve can also have a piezoelectrically inactive covering layer similar to the covering layer 18.

Furthermore, the contact points of the connecting conductors 16, 17 can be provided on the circumference as well as on the end face 9 of the covering layer 18, which signifies a combination of the exemplary embodiments according to FIGS. 1 and 2.

Taken together, the piezoelectric actuator described by way of example above with reference to FIGS. 1 and 2, offers a simple and reliable contact that is highly durable and has a low tendency toward fracture development in the contacting solder over the service life of the actuator since the contacting of the common electrode strips with the voltage-supplying connecting conductors is taken out of the piezoelectrically active region of the actuator.

The foregoing relates to preferred exemplary embodiments of the invention, it being understood that other variants and embodiments thereof is possible within the spirit and scope of the invention, the latter being defined by the appended claims.

We claim:

1. In a piezoelectric actuator for actuating control valves or injection valves in motor vehicles and having an actuator body (10) in the form of a multilayered laminate made up of stacked layers of piezoelectric material (11) with intervening metallic or electrically conductive layers (12,13) that function as electrodes, which alternatingly contact common electrode strips (14,15) disposed on the circumference in the longitudinal direction of the actuator body (10), and having electrical connecting conductors (16,17) which, in order to supply the operating voltage to the piezoelectric actuator (10), electrically contact the respective common electrode strips (14,15), the improvement wherein on at least one end face (9) remote from the valve, the actuator body (10) has a covering layer (18) made of piezoelectrically inactive ceramic material and wherein the connecting conductors (16,17) electrically contact the common electrode strips (14,15) only in the vicinity of this covering layer (18), wherein the common electrode strips (14,15) each lead to and extend at least partially over the end face (9) of the covering layer (18) and contact the connecting conductors (16,17) on the end face.

2. The piezoelectric actuator according to claim 1, wherein the connecting conductors (16, 17) are soldered to the common electrode strips (14, 15).

3. The piezoelectric actuator according to claim 1, wherein the connecting conductors (16, 17) electrically contact the common electrode strips by means of a clamped connection.

4. The piezoelectric actuator according to claim 1, wherein on two diametrically opposite sides of the circumference of the actuator body (10), the electrode layers (12, 13) electrically contact the respective common electrode strips (14, 15) and that the contact points where the connecting conductors (16, 17) contact the respective electrode strip are likewise disposed in these diametrically opposite positions.

5. In a piezoelectric actuator for actuating control valves or injection valves in motor vehicles and having an actuator body (10) in the form of a multilayered laminate made up of stacked layers of piezoelectric material (11) with intervening metallic or electrically conductive layers (12, 13) that function as electrodes, which alternatingly contact common electrode strips (14,15) disposed on the circumference in the longitudinal direction of the actuator body (10), and having electrical connecting conductors (16,17) which, in order to supply the operating voltage to the piezoelectric actuator (10), electrically contact the respective common electrode strips (14,15), the improvement wherein on at least one end face (9) remote from the valve, the actuator body (10) has a covering layer (18) made of piezoelectrically inactive ceramic material and wherein the connecting conductors (16,17) electrically contact the common electrode strips (14,15) only in the vicinity of this covering layer (18), wherein the common electrode strips (14,15) electrically contact the connecting conductors (16,17) on the circumference of the covering layer (18) and the common electrode strips (14,15) each lead to and extend at least partially over the end face (9) of the covering layer (18) and contact the connecting conductors (16,17) on the end face.

* * * * *